(12) United States Patent
McCormick et al.

(10) Patent No.: US 10,114,257 B2
(45) Date of Patent: *Oct. 30, 2018

(54) CONDUCTING FILM OR ELECTRODE WITH IMPROVED OPTICAL AND ELECTRICAL PERFORMANCE FOR DISPLAY AND LIGHTING DEVICES AND SOLAR CELLS

(71) Applicant: 3M INNOVATIVE PROPERTIES COMPANY, St. Paul, MN (US)

(72) Inventors: Fred B. McCormick, Maplewood, MN (US); Sergey Lamansky, Redmond, WA (US); Leslie A. Todero, Omaha, NE (US); Manoj Nirmal, St. Paul, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 26 days.

This patent is subject to a terminal disclaimer.

(21) Appl. No.: 15/398,816

(22) Filed: Jan. 5, 2017

(65) Prior Publication Data

US 2017/0115521 A1    Apr. 27, 2017

Related U.S. Application Data

(62) Division of application No. 12/540,394, filed on Aug. 13, 2009, now Pat. No. 9,581,870.

(51) Int. Cl.
*G02F 1/1343* (2006.01)
*H01L 51/44* (2006.01)
(Continued)

(52) U.S. Cl.
CPC ........ *G02F 1/13439* (2013.01); *G02F 1/1334* (2013.01); *G02F 1/133305* (2013.01);
(Continued)

(58) Field of Classification Search
CPC ................. G02F 1/1335; G02F 1/1336; G02F 1/133602; G02F 1/133617; G02F 1/061; G02F 1/133305; G02F 1/134309; G02F 1/136; G02F 2001/1676; G02F 2201/50; G02F 2202/28; H01L 27/3244; H01L 27/3258; H01L 27/3225;
(Continued)

(56) References Cited

U.S. PATENT DOCUMENTS 5,350,459 A    9/1994    Suzuki et al.
5,440,446 A    8/1995    Shaw et al.
(Continued)

FOREIGN PATENT DOCUMENTS

CN    1711649    12/2005
JP    01-028617    1/1989
(Continued)

*Primary Examiner* — Thoi Duong (57) ABSTRACT

A conducting film or device multilayer electrode includes a substrate and two transparent or semitransparent conductive layers separated by a transparent or semitransparent intervening layer. The intervening layer includes electrically conductive pathways between the first and second conductive layers to help reduce interfacial reflections occurring between particular layers in devices incorporating the conducting film or electrode.

7 Claims, 5 Drawing Sheets

(51) Int. Cl.
  *H01L 51/52* (2006.01)
  *H01L 31/0224* (2006.01)
  *G02F 1/1333* (2006.01)
  *G02F 1/1334* (2006.01)
  *G02F 1/167* (2006.01)

(52) U.S. Cl.
  CPC ........ *G02F 1/133345* (2013.01); *G02F 1/167* (2013.01); *H01L 31/022466* (2013.01); *H01L 31/022475* (2013.01); *H01L 51/442* (2013.01); *H01L 51/5215* (2013.01); *G02F 2001/1676* (2013.01); *G02F 2201/42* (2013.01); *G02F 2203/01* (2013.01); *Y02E 10/549* (2013.01)

(58) Field of Classification Search
  CPC ........... H01L 2924/12044; H01L 33/42; H01L 33/24; H01L 33/465; H01L 33/486; H01L 2251/301; H01L 2251/5338; H01L 24/83; H01L 24/13; H01L 24/81; H01L 51/5056; H01L 51/5203; H01L 51/0587; H01L 51/5234; H01L 51/0097; H01L 51/5012; H01L 51/504; H01L 51/5088; H01L 51/0023; H01L 51/5215; H01L 51/5228; H01L 51/5256; H01L 2224/81903; H01L 2224/80895; H01L 2224/81; H01L 2224/83193; H01L 2224/8385; H01L 2224/02123; H01L 2224/13008; H01L 2224/1411; H01L 2224/16237; H01L 2224/75305; H01L 2224/81191; H01L 2224/951; H01L 28/60; H01L 31/02167; H05B 33/0896; H05B 37/00
  USPC .................................. 257/72; 349/61, 50, 69
  See application file for complete search history.

(56) References Cited

U.S. PATENT DOCUMENTS

| | | | |
|---|---|---|---|
| 5,629,783 A | 5/1997 | Kanbara et al. | |
| 5,667,853 A | 9/1997 | Fukuyoshi et al. | |
| 5,672,937 A | 9/1997 | Choi et al. | |
| 5,682,043 A | 10/1997 | Pei et al. | |
| 5,877,895 A | 3/1999 | Shaw et al. | |
| 5,920,080 A * | 7/1999 | Jones ................ H01L 51/5259 257/103 | |
| 6,010,751 A | 1/2000 | Shaw et al. | |
| 6,124,971 A | 9/2000 | Ouderkirk et al. | |
| 6,177,216 B1 | 1/2001 | Broer et al. | |
| 6,580,482 B1 | 6/2003 | Hiji et al. | |
| 6,597,419 B1 | 7/2003 | Okada et al. | |
| 6,812,977 B1 | 11/2004 | Iwamatsu et al. | |
| 6,839,108 B1 | 1/2005 | Hirakata et al. | |
| 6,999,142 B2 | 2/2006 | Stephenson et al. | |
| 7,115,216 B2 | 10/2006 | Carter et al. | |
| 7,365,900 B2 | 4/2008 | Yamamoto | |
| 7,468,211 B2 | 12/2008 | McCormick et al. | |
| 7,495,820 B2 | 2/2009 | Sakurai et al. | |
| 7,538,483 B2 | 5/2009 | Mikami | |
| 9,581,870 B2 * | 2/2017 | McCormick ........ G02F 1/13439 |
| 2001/0040542 A1 | 11/2001 | Harada et al. | |
| 2002/0051103 A1 | 5/2002 | Faris et al. | |
| 2002/0118325 A1 | 8/2002 | Hinata et al. | |
| 2002/0176041 A1 | 11/2002 | Hisamitsu et al. | |
| 2003/0020844 A1 | 1/2003 | Albert et al. | |
| 2003/0124392 A1 | 7/2003 | Bright | |
| 2003/0160923 A1 | 8/2003 | Ma | |
| 2003/0231269 A1 | 8/2003 | Ma | |
| 2004/0032556 A1 | 2/2004 | Yoon et al. | |
| 2004/0046909 A1 | 3/2004 | Sekiguchi | |
| 2004/0125286 A1 | 7/2004 | Moon et al. | |
| 2004/0246411 A1 | 12/2004 | Stephenson et al. | |
| 2004/0263755 A1 | 12/2004 | Kim et al. | |
| 2005/0041183 A1 | 2/2005 | Lee | |
| 2005/0259208 A1 | 11/2005 | Miki et al. | |
| 2006/0012847 A1 | 1/2006 | Ogasawara | |
| 2006/0087863 A1 | 4/2006 | Choi et al. | |
| 2006/0091405 A1 | 5/2006 | Kwak | |
| 2006/0119782 A1 | 6/2006 | Sha et al. | |
| 2006/0147652 A1 | 7/2006 | Liu et al. | |
| 2006/0181658 A1 | 8/2006 | Majumdar et al. | |
| 2006/0182898 A1 | 8/2006 | Ben-Shalom et al. | |
| 2006/0244702 A1 | 11/2006 | Yamazaki et al. | |
| 2006/0262247 A1 | 11/2006 | Stephenson, III et al. | |
| 2007/0002422 A1 | 1/2007 | O'Shaughnessy | |
| 2007/0181878 A1 | 8/2007 | Song et al. | |
| 2007/0285611 A1 | 12/2007 | Nose et al. | |
| 2008/0038529 A1 | 2/2008 | Nakayama et al. | |
| 2008/0105298 A1 | 5/2008 | Lu et al. | |
| 2009/0316060 A1 | 12/2009 | Nirmal et al. | |
| 2010/0272933 A1 * | 10/2010 | McCormick ........... C09J 7/0296 428/34.1 |

FOREIGN PATENT DOCUMENTS

| | | |
|---|---|---|
| JP | 01-261495 | 10/1989 |
| JP | H02199790 | 8/1990 |
| JP | 09-113881 | 5/1997 |
| JP | 09-291355 | 11/1997 |
| JP | 10-031210 | 2/1998 |
| JP | 11008075 | 1/1999 |
| JP | 2001-297630 | 10/2001 |
| JP | 2003-057648 | 2/2003 |
| JP | 2005-019056 | 1/2005 |
| JP | 2009-021073 | 1/2009 |
| JP | 2009-146747 | 7/2009 |
| KR | 2005-0020339 | 3/2005 |
| WO | WO 1999/26107 | 5/1999 |
| WO | WO 2002/073306 | 9/2002 |
| WO | WO 2003/060604 | 7/2003 |
| WO | WO 2006/054050 | 5/2006 |
| WO | WO 2007/004286 | 1/2007 |
| WO | WO 2009/008535 | 1/2009 |
| WO | WO 2009/050145 | 4/2009 |

* cited by examiner

CONDUCTING FILM OR ELECTRODE WITH IMPROVED OPTICAL AND ELECTRICAL PERFORMANCE FOR DISPLAY AND LIGHTING DEVICES AND SOLAR CELLS

BACKGROUND

A cholesteric liquid crystal (ChLC) material consists of a nematic liquid crystal and a chiral additive blended together to spontaneously form a helical structure with a well defined pitch. This pitch determines the wavelength of light reflected by the material and hence the color of it. The color can also be adjusted by varying the ratio of the nematic liquid crystal and chiral components. A pixel in a ChLC display can be switched between its planar reflective (colored) state and its semi-transparent focal conic state by application of an appropriate drive scheme.

Figure 1:
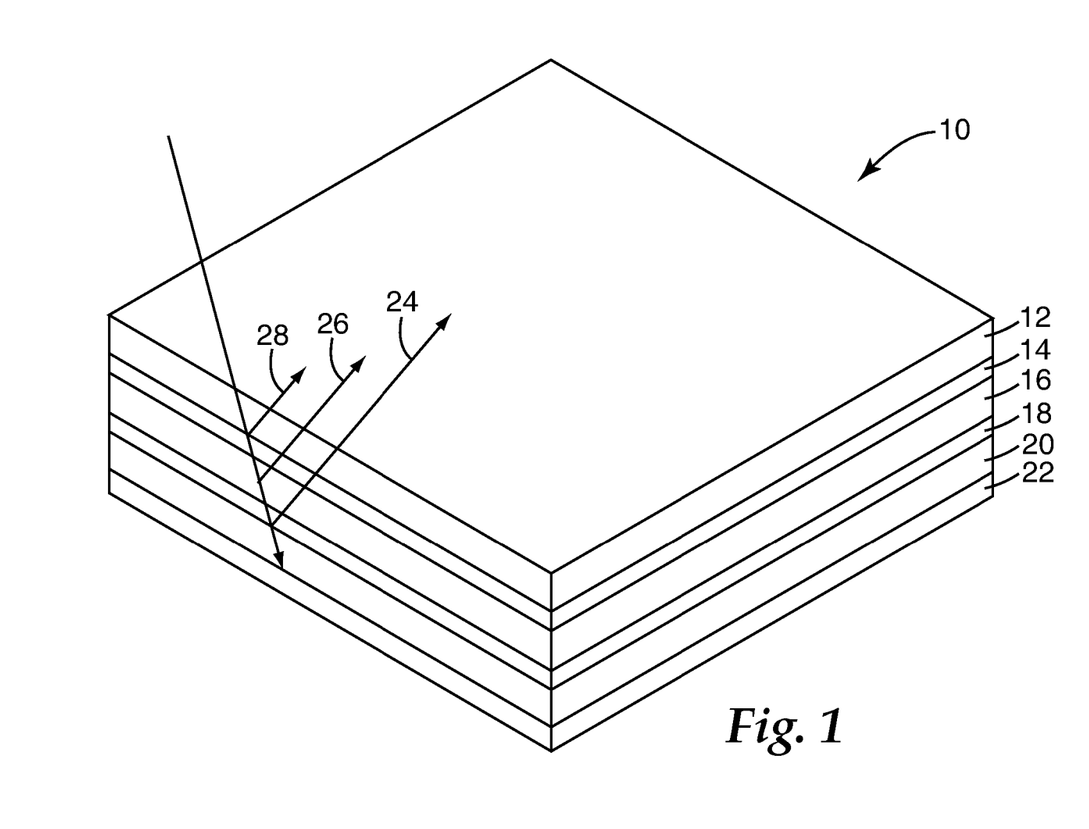
FIG. 1 is a perspective diagram of a single color ChLC display construction.
Figure 2:
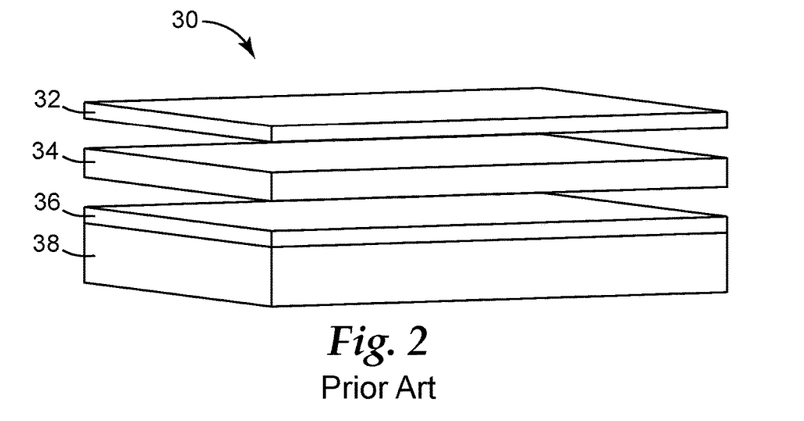
FIG. 2 is a diagram of a prior art electrode for a ChLC display.

FIG. 1 illustrates a single color ChLC display 10, including a stack having the following layers in the configuration as shown: a substrate 12; an electrode 14; a ChLC material 16; an electrode 18; a substrate 20; and a black absorber 22. A reflection 26 from ChLC material 16 results in a displayed color. A full color ChLC display can be constructed by stacking a set of RGB panels with the individual RGB subpixels overlapped on top of each other and reflecting different regions of the spectrum. The back of the display panel is coated with broadband absorber 22 that absorbs the light not reflected by the preceding layers. Black absorbers include the following exemplary materials: KRYLON matte or glossy black acrylic enamel spray paint. FIG. 2 illustrates a prior art electrode 30 for a ChLC display. A substrate 38 provides support for the device. The prior art electrode includes two layers of transparent conductive oxide (TCO) layers 32 and 36 separated by a continuous layer of dielectric polymer 34.

Interfacial reflections 24 and 28, shown in FIG. 1, can occur between the layers, for example at the interfaces of the substrates and electrodes, and such interfacial reflections are undesirable in that they degrade device performance. Reflection losses in other types of reflective and emissive displays can also be detrimental to their performance. Furthermore, for flexible displays and solid state lighting devices, the brittleness of standard TCOs, such as indium tin oxide (ITO), can lead to premature device failure due to cracking and loss of conductivity of the TCO.

SUMMARY

A conducting film or electrode, consistent with the present invention, includes a substrate and two transparent or semi-transparent conductive layers separated by a transparent or semitransparent intervening layer. The intervening layer, which helps reduce unwanted interfacial reflections occurring in a device incorporating this electrode, includes electrically conductive pathways between the two conductive layers. The intervening layer also improves the durability of the conductive layers under conditions of flexing and bending. Use of the intervening layer and the conductive pathways between the conductive layers allows for thinner individual conductive layers. The thinner individual conductive layers are more flexible than a single conductive layer of the same combined conductive layer thickness. Flexing a single thick conductive layer would cause cracking under conditions where the two thinner conductive layers would survive intact. The conductive pathways between the two conductive layers also provide redundant electrical pathways such that cracking in one conductive layer will not lead to overall loss of conductivity. In a single thick conductive layer, cracking can lead to open circuits and premature device failure. The intervening layers may be chosen to optimize the overall flexibility of the conducting film.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Embodiments of the present invention relate to device substrate electrodes with improved electrical and optical properties. The electrodes can be used in any display where, for example, reflections resulting between layers are detrimental to device performance. The electrodes can also be used with a variety of types of display materials such as ChLC material or electrochromic material. The term display material refers to any type of material activated by an electrode in a display device. Other display devices that can incorporate the electrodes include liquid crystal display devices, electrophoretic, inorganic electroluminescent, polymer dispersed liquid crystal, and organic light emitting diode (OLED) devices. The electrodes can also be used in non-display devices such as, for example, passive windows, smart window, solar cells, solid state lighting, and electro-optic devices.

Other embodiments of the present invention include a conducting film not used as a display device electrode. Such a conducting film can be used in film applications where the conductivity provides for infrared reflection. Examples of such film applications include the following: window; lighting; architectural; automotive; appliance; and scientific instrument. The conducting films can also be used in lighting and projectors where visible light is transmitted and infrared heat is reflected by the film.

The electrode or conducting film includes two or more conductive layers having a particular refractive index with intervening conductive or insulating layers having a different refractive index and having electrically conductive pathways. The conductive layers and intervening layers are each transparent or semitransparent. The thicknesses of the individual layers and the optical indexes of refraction of the individual layers within the electrode stack are tuned to minimize unwanted Fresnel reflections when these substrates are incorporated within a ChLC display. In a preferred embodiment, the conductive layers are symmetric, meaning they have the same thickness. In other embodiments, the conductive layers can have different thicknesses.

This electrode construction significantly improves the black level, color saturation, and hence the contrast of the display. In addition, the intervening layers permit electrical contact between the conductive layers of the electrode. As a result, the electrical conductivity of the multilayer electrode is higher than that of the individual conductive layers within the stack. Since the size of the display may be limited by the sheet resistance of the electrodes, the multilayer electrode enables the fabrication of larger display panels. Displays fabricated using the multilayer electrodes exhibit significantly improved electrical and optical performance compared with devices having single layer electrodes.

Unlike a conventional nematic liquid crystal (NLC) based display, a ChLC display does not require polarizers or color filters, resulting in a simpler device construction at a potentially lower cost. In a full color NLC display, the red-green-blue (RGB) subpixels are arranged side by side. As a result, only one third of the viewing area is occupied by each of the individual RGB primaries. On the other hand, each ChLC RGB subpixel reflects a single primary color while transmitting the other two.

Each subpixel in a ChLC display includes the ChLC material sandwiched between two conductive substrates. The subpixels may be bonded together using an optical adhesive. Alternatively, the conductor may be coated and patterned on both sides of each substrate, eliminating the optical adhesive layers. Red and yellow color filters may be included to improve color saturation and minimize color shifts with viewing angle. The observed color of each stacked pixel is determined by the sum of the reflections from each subpixel. The entire viewing area is utilized by the RGB primaries resulting in significantly improved brightness.

In its on (reflective) state, the light reflected by a pixel includes the ChLC planar reflection and unwanted Fresnel reflections at each interface due to refractive index mismatches, represented by reflections 24 and 28 (see FIG. 1). Fresnel reflections are typically broadband and hence degrade the color saturation of the display. In its off state, the light reflected by a pixel includes scattering from the semitransparent focal-conic state and the interfacial Fresnel reflections. These reflections degrade the black level of the display and hence the contrast ratio.

The magnitude of the Fresnel reflection depends on the ratio of refractive indices at the interface. At normal incidence it is determined by the following equation:

$$R = \left(\frac{n-1}{n+1}\right)^2;$$
$$n = \frac{n_2}{n_1}$$

where n is the relative index of the two media with refractive indices n2, n1. Fresnel reflections are strongest at interfaces with the highest relative index. The refractive indices of the various layers of device 10 shown in FIG. 1 are the following: n=2.0 for the electrodes; n=1.65 for the substrate; and n=1.55 for the ChLC material. In device 10, the highest index step thus occurs at the interfaces between the high index indium tin oxide (ITO) transparent electrode and the polyethylene terephthalate (PET) substrate or the ChLC. Device 10 includes two ITO/PET and two ITO/ChLC interfaces. Depending on the illumination and viewing geometry, broadband Fresnel reflections from these interfaces can exceed the reflectivity of the ChLC, significantly degrading display performance.

In comparison, the electrode design of embodiments of the present invention yields both good optical and electrical performance. The intervening layer in the electrode design is a transparent or semitransparent layer having electrically conductive pathways that enable electrical contact between the two conductive layers. The pathways may form naturally by controlling the thickness and deposition conditions of the intervening layer. The chemical and physical properties of the first conductive layer nearest the substrate may also be adjusted to enable formation of these pathways by changing the wetting properties of the intervening layer such that the intervening layer is discontinuous to allow electrical contact between the adjacent layers. Alternatively, the pathways could be created using techniques such as laser ablation, ion bombardment or wet/dry etching.

The intervening layer may be deposited using vapor deposition techniques such as sputtering, e-beam, and thermal evaporation. The intervening layer can include polymers, including copolymers, such as polyacrylates, polymethacrylates, polyolefins, polyepoxides, polyethers, and the like, and inorganic materials such as metal oxides, nitrides, carbides, and mixtures thereof. Preferred non conductive intervening layers include polyacrylates and silicon oxides. The intervening layer may also be formed using solution coating. An ultrabarrier film process, in which a monomer is evaporated onto the substrate and cured in-situ, may also be used. Ultrabarrier films include multilayer films made, for example, by vacuum deposition of two inorganic dielectric materials sequentially in a multitude of layers on a glass or other suitable substrate, or alternating layers of inorganic materials and organic polymers, as described in U.S. Pat. Nos. 5,440,446; 5,877,895; and 6,010,751, all of which are incorporated herein by reference as if fully set forth.

Figure 3:
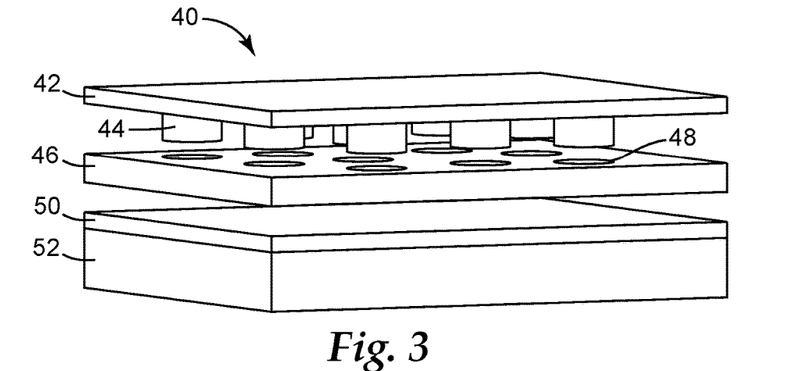
FIG. 3 is a diagram of a device electrode having an intervening layer with conductive paths.

One embodiment is shown as a multilayer device electrode 40 of FIG. 3. This electrode includes two high index conductive layers 42 and 50 of TCO or semitransparent conductive oxide separated by a lower index transparent or semitransparent layer 46 having electrically conductive pathways comprising conductive links 44 extending through apertures 48 in transparent layer 46 to connect the electrodes 42 and 50. A substrate 52 provides support for the device. The layers are drawn apart to illustrate the concept.

Figure 4:
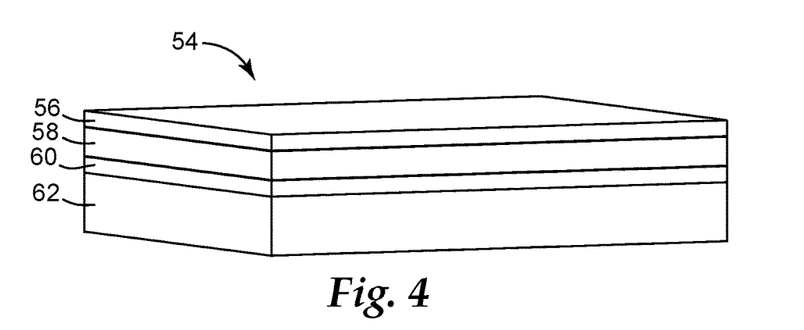
FIG. 4 is a diagram of a device electrode having an intervening conductive layer.

In another embodiment, the intervening layer is a transparent or semitransparent conductor with a lower refractive index than the conductive layers on either side, as shown in multilayer device electrode 54 of FIG. 4. In electrode 54, the intervening conductive layer 58 may provide continuous electrically conductive pathways between the two adjacent conductive layers 56 and 60 of TCO or semitransparent conductive oxide. A substrate 62 provides support for the display. The intervening layer 58 may comprise a solution coated or electro-deposited conductive polymer. It can also be a vapor deposited transparent conductor. Conducting polymers include the following exemplary materials: polyaniline; polypyrrole; polythiophene; and PEDOT/PSS (poly (3,4-ethylenedioxythiophene)/polystyrenesulfonic acid). The combined thickness of the conductive layers is constrained by the sheet resistance requirements while the thicknesses of the individual layers are optimized for the desired optical properties.

Figure 5:
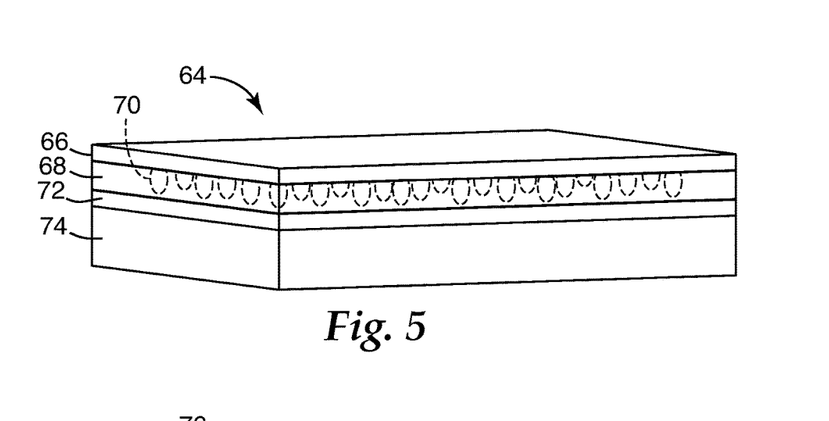
FIG. 5 is a diagram of a device electrode having an intervening layer with conductive particles dispersed in a binder.

In yet another embodiment, the intervening layer comprises conductive particles dispersed in a binder, as shown in multilayer device electrode 64 of FIG. 5. The conductive particles 70 in binder 68 provide conductive pathways between the conductive layers 66 and 72 of TCO or semitransparent conductive oxide. A substrate 74 provides support for the device. The binder can be conductive or insulating. The conductive particles can be organic, inorganic, or metallic. Conductive particles also include metal coated particles. The refractive index of the intervening layer can be adjusted by varying the volume fractions of the binder and conductive particles.

The matrix and embedded conducting nanoparticles for the multilayer electrodes can include the following. The matrix can include any transparent or semitransparent (conductive or insulating) polymer (e.g., acrylates, methacrylates, or the conducting polymers listed above), or a transparent or semitransparent inorganic material either conductive (such as the TCOs listed above) or insulating ($SiO_2$, silicon nitride ($Si_xN_y$), Zinc Oxide (ZnO), aluminum oxide ($Al_2O_3$), or magnesium fluoride ($MgF_2$)). The conducting nanoparticles can include conducting polymers such as those listed above, metals (e.g., silver, gold, nickel, chrome), or metal coated particles. If the matrix is conductive then the nanoparticles can be insulating, in particular they can be nanoparticles of the insulating materials listed above (e.g., $SiO_2$, silicon nitride, zinc oxide, or other insulating materials.)

Substrates for devices using the multilayer electrodes can include any type of substrate material for use in making a display or electronic device. The substrate can be rigid, for example by using glass or other materials. The substrate can also be curved or flexible, for example by using plastics or other materials. Substrates can be made using the following exemplary materials: glass; polyethylene terephthalate (PET); polyethylene napthalate (PEN); polycarbonate (PC); polyetherketone (PEEK); polyethersulphone (PES); polyarylate (PAR); polyimide (PI); poly(methyl methacrylate) (PMMA); polycyclic olefin (PCO); cellulose triacetate (TAC); and polyurethane (PU).

Other suitable materials for the substrate include chlorotrifluoroethylene-vinylidene fluoride copolymer (CTFE/VDF), ethylene-chlorotrifluoroethylene copolymer (ECTFE), ethylene-tetrafluoroethylene copolymer (ETFE), fluorinated ethylene-propylene copolymer (FEP), polychlorotrifluoroethylene (PCTFE), perfluoroalkyl-tetrafluoroethylene copolymer (PFA), polytetrafluoroethyloene (PTFE), polyvinylidene fluoride (PVDF), polyvinyl fluoride (PVF), tetrafluoroethylene-hexafluoropropylene copolymer (TFE/HFP), tetrafluoroethylene-hexafluoropropylene-vinylidene fluoride terpolymer (THV), polychlorotrifluoroethylene (PCTFE), hexafluoropropylene-vinylidene fluoride copolymer (HFP/VDF), tetrafluoroethylene-propylene copolymer (TFE/P), and tetrafluoroethylene-perfluoromethylether copolymer (TFE/PFMe).

Other suitable substrates include barrier films and ultrabarrier films. An example of a barrier film is described in U.S. Pat. No. 7,468,211, which is incorporated herein by reference as if fully set forth. Ultrabarrier films include multilayer films made, for example, by vacuum deposition of two inorganic dielectric materials sequentially in a multitude of layers on a glass or other suitable substrate, or alternating layers of inorganic materials and organic polymers, as described in U.S. Pat. Nos. 5,440,446; 5,877,895; and 6,010,751, all of which are incorporated herein by reference as if fully set forth. TCOs for the multilayer electrodes include the following exemplary materials: ITO; tin oxides; cadmium oxides ($CdSn_2O_4$, $CdGa_2O_4$, $CdIn_2O_4$, $CdSb_2O_6$, $CdGeO_4$); indium oxides ($In_2O_3$, Ga, $GaInO_3$ (Sn, Ge), $(GaIn)_2O_3$); zinc oxides (ZnO(Al), ZnO(Ga), $ZnSnO_3$, $Zn_2SnO_4$, $Zn_2In_2O_5$, $Zn_3In_2O_6$); and magnesium oxides ($MgIn_2O_4$, $MgIn_2O_4$—$Zn_2In_2O_5$).

Figure 6:
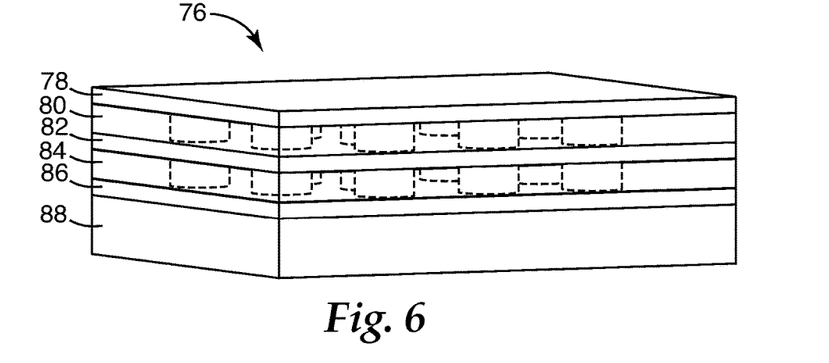
FIG. 6 is a diagram of a device electrode having multiple intervening layers and a conductive layer to be in contact with a display medium.
Figure 7:
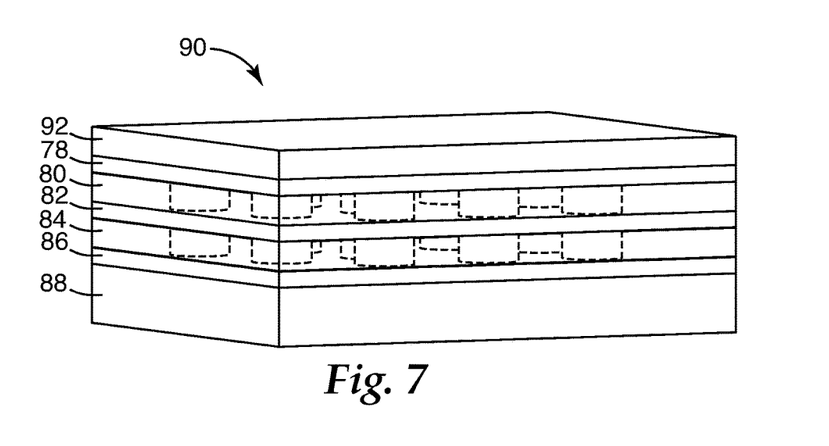
FIG. 7 is a diagram of a device electrode having multiple intervening layers and an insulating layer to be in contact with a display medium.

While the embodiments described above include two transparent or semitransparent conductive layers separated by an intervening layer, additional transparent or semitransparent conductive and intervening layers may be added depending on the desired optical and electrical properties, as shown in FIGS. 6 and 7. Device electrodes 76 and 90 shown in FIGS. 6 and 7 include the following layers functioning as a single electrode: multiple transparent or semitransparent conductive layers 78, 82, and 86; intervening transparent or semitransparent layers 80 and 84 between the conductive layers; and a substrate 88. Additional layers of conductive layers and intervening layers can be added as well such that the electrode has any number of layers optimized or tuned for a particular device. Also, the layer in contact with the display medium, when the electrode is used with a display device, may be insulating or conductive depending on the switching mechanism (e.g., current or field driven), such as conductive layer 78 shown in FIG. 6 or an insulating layer 92 shown in FIG. 7. Furthermore, the multilayer electrode can be "tuned" to different optical properties for desired end uses. For example, the materials for the intervening layer, and the thicknesses of the layers, can be varied for a desired use or property, such as for matching with a multilayer barrier substrate or an OLED optical cavity to enhance light outcoupling.

For a three color ChLC display, the electrodes for each color can be designed or tuned for a particular wavelength range in order to minimize interfacial reflections. Table 1 includes thicknesses in nanometers (nm) of an optimized electrode construction for individual colors (RGB ChLC material layers) in a ChLC display device.

TABLE 1

| Electrode | Conductive Layer (ITO) | Intervening Layer | Conductive Layer (ITO) |
|---|---|---|---|
| blue layer | 20 | 42.8 | 20 |
| green layer | 20 | 46.88 | 20 |
| red layer | 20 | 56.11 | 20 |

The multilayer electrodes can be used with other display devices such as electrophoretic devices (including use of Bridgestone's powder), polymer dispersed liquid crystal (PDLC) devices, and inorganic electroluminescence (IEL) displays and lighting devices. Examples of electrophoretic, PDLC, and IEL devices are described in, respectively, U.S. Pat. Nos. 7,365,900; 5,629,783; and 7,538,483, all of which are incorporated herein by reference as is fully set forth. Bridgestone's powder is described in the publication entitled "Quick Response-Liquid Powder Display (QR-LPD)" from Bridgestone Corporation and is also described in U.S. Pat. No. 7,495,820, which is incorporated herein by reference as if fully set forth.

The multilayer electrodes can also be used with OLED display and lighting devices. OLEDs refers to electroluminescent devices that include an organic emissive material. The emissive material can include, for example, a small molecule (SM) emitter, a SM doped polymer (also referred to as a molecularly doped polymer or MDP), a light emitting polymer (LEP), a doped LEP, a blended LEP, or any combination of these materials. This emissive material can be provided alone or in combination with any other organic or inorganic materials, including, for example, binders, color converting materials, scattering materials, and electrolytes that are functional or non-functional in the OLED device. Addition of electrolyte provides for light emitting electrochemical cells (LECs), such as those described in U.S. Pat. No. 5,682,043, which is incorporated herein by reference as if fully set forth. LECs are a class of OLEDs with manufacturing advantages as described in U.S. Pat. No. 7,115,216, which is incorporated herein by reference as if fully set forth. The organic emissive materials and additional materials, such as charge injection and transport materials, are typically sandwiched as single or multiple layers between two planar electrodes, one of which is typically transparent, to create diffuse light sources or pixilated displays. R. H. Friend, et al. ("Electroluminescence in Conjugated Polymers" Nature, 397, 1999, 121, incorporated herein by reference as if fully set forth) describes one mechanism of electroluminescence of such material.

Figure 8:
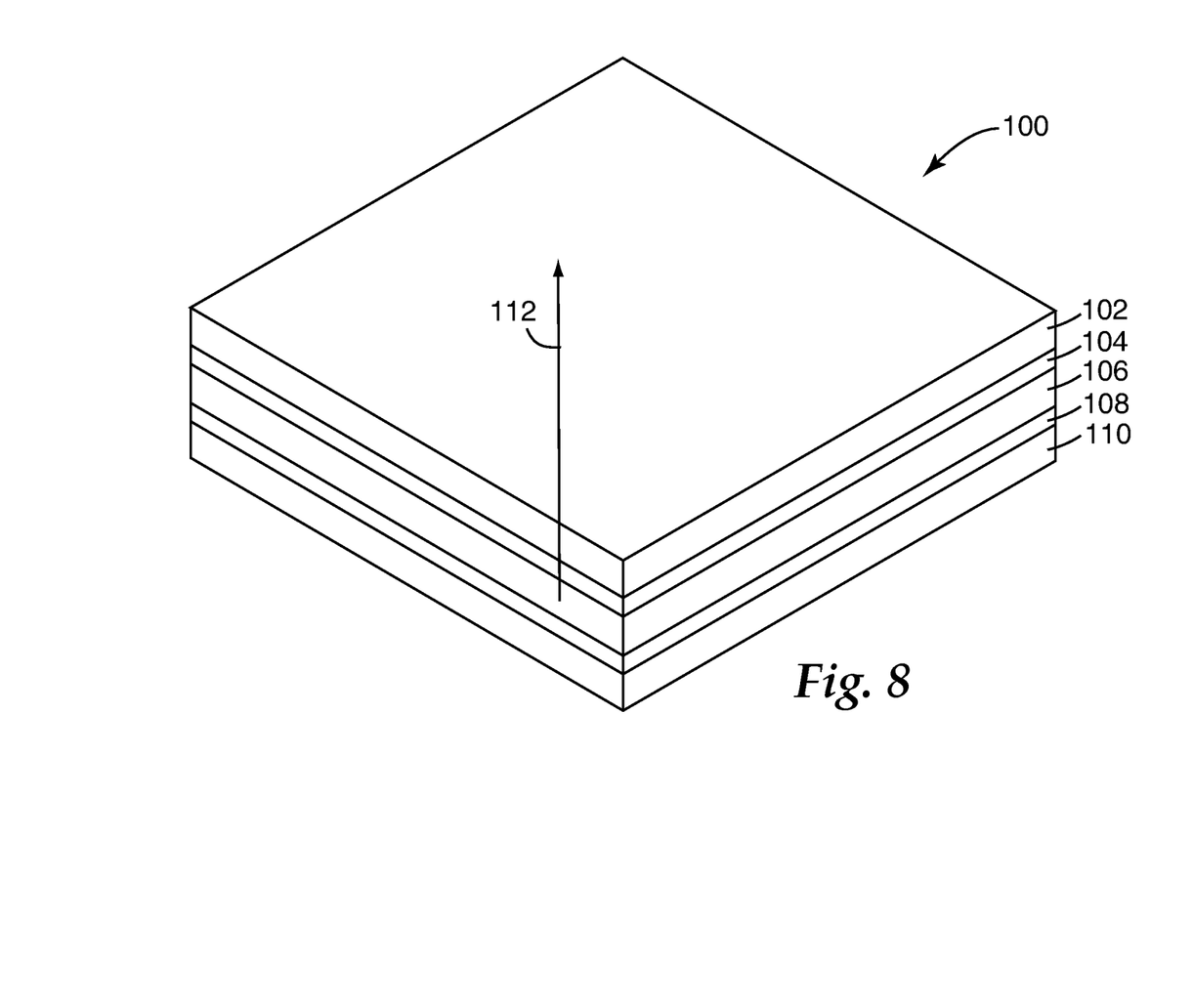
FIG. 8 is a perspective diagram illustrating a light emitting device.

FIG. 8 is a perspective diagram illustrating a light emitting device 100 that can incorporate the multilayer electrodes. Device 100 includes a stack having the following layers in the configuration as shown: a substrate 102; an electrode 104; a light emitting material 106; an electrode 108; and a substrate 110. One or both of electrodes 104 and 106 can be implemented with the multilayer electrode embodiments described above. Light emitting material 106 when activated emits light as represented by arrow 112, and the light emitting can include OLED or IEL material, or other types of light emitting material for display or solid state lighting devices. Device 100 can also have additional layers, such as insulating layers between the electrodes and the light emitting layer for an IEL device.

Figure 9:
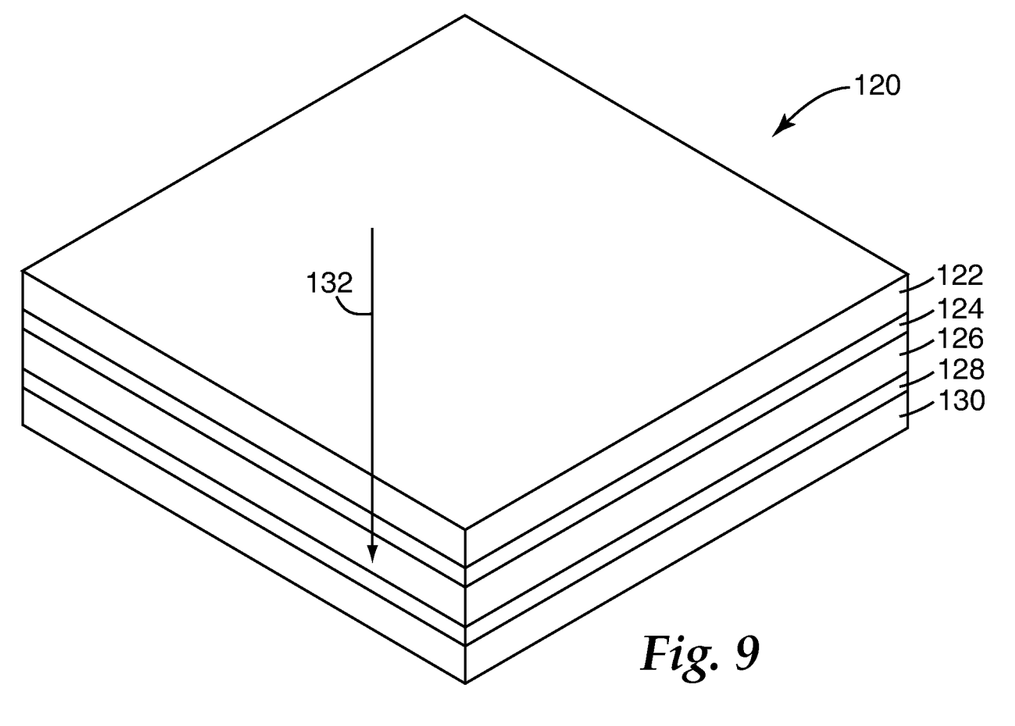
FIG. 9 is a perspective diagram illustrating a solar cell.

FIG. 9 is a perspective diagram of a solar cell 120 that can incorporate the multilayer electrodes. Solar cell 120 includes a stack having the following layers in the configuration as shown: a substrate 122; an electrode 124; an active material 126; an electrode 128; and a substrate 130. One or both of electrodes 124 and 126 can be implemented with the multilayer electrode embodiments described above. Active material 126 absorbs light as represented by arrow 132 for activating the solar cell in order to convert light energy to electrical energy. Solar cells include photovoltaic cells, especially organic photovoltaic (OPV) solar cells. An example of an OPV solar cell is described in U.S. Pat. No., 5,350,459, which is incorporated herein by reference as if fully set forth. A TCO electrode, as part of the multilayer electrode, on the side of the solar cell receiving the light can reduce reflectivity losses and thus improve the device efficiency of the solar cell. The solar cell can also include barrier films to protect the cell, and particularly the active material, from the environment.

EXAMPLES

Example 1

Substrates with the three-layer electrode design shown in FIG. 4 were fabricated. The intervening layer consisted of an acrylate polymer deposited using the ultrabarrier process identified above, and the two conductive layers consisted of sputter deposited ITO. Three layer electrodes with different intervening layer and ITO layer thicknesses were fabricated on a roll of 0.005 inch thick PET as identified in Table 2.

TABLE 2

| Design | ITO 1 fpm | Polymer fpm | ITO 2 fpm |
|---|---|---|---|
| 1 | 3.8 | 68 | 3.8 |
| 2 | 4.3 | 68 | 4.3 |
| 3 | 4.8 | 68 | 4.8 |
| 4 | 4.8 | 66 | 4.8 |
| 5 | 3.8 | 66 | 3.8 |
| 6 | 3.8 | 64 | 3.8 |
| 7 | 4.3 | 64 | 4.3 |
| 8 | 4.8 | 64 | 4.8 |

The individual layer thicknesses were determined by the speed of the film in feet per minute (fpm) across the ITO and ultrabarrier film deposition sources. Faster speeds yield thinner layers. The sheet resistance of these samples was measured using a non-contact probe (Delcom) that measures the combined conductivity of both ITO layers and a surface contact 4-probe instrument that measures the conductivity of the top, exposed surface. Both measurement techniques yielded sheet resistance values that are identical within the measurement error indicating that the intervening layer permits electrical contact between the two adjacent ITO layers.

Full color RGB, ChLC devices fabricated using substrates having index matched three-layer electrodes, and single layer non-index matched electrodes were compared. The broadband, interfacial reflection was much more pronounced with the non-index matched electrode. These reflections degrade the color saturation relative to devices with index matched electrodes.

The color gamut of the device with the index matched electrodes was three times larger than that of the device with the non-index matched electrodes. The stronger interfacial reflections also degraded the black level of devices with non-index matched electrodes relative to those with index matched electrodes. As a result the contrast ratio, defined as the ratio of the brightness (CIE Y) of the white to black states, was much higher for devices with index matched electrodes.

Devices were also fabricated from three-layer electrode substrates in which the intervening layer consisted of $SiO_2$, an inorganic material instead of the ultrabarrier film layer. The three-layer electrode consisted of ITO (20 nm)/$SiO_2$ (42 nm)/ITO (20 nm), which were sputtered onto 5 mil PET (Dupont Teijin, ST-504). These substrates also exhibited improved electrical and optical properties when incorporated into ChLC, RGB devices. Both the color saturation (Gamut) and contrast were significantly higher for the device with the index matched, three-layer electrode. The color gamut was over four times larger and the contrast over five times higher with the three-layer index matched electrode.

The three layer electrode design also enables low sheet resistance in conjunction with good optical performance. Each intervening low index layer permits electrical contact between the adjacent transparent conductive layers. As a result the conductivity of the multilayer electrode is determined by the combined thickness of all the conductive layers. A display was fabricated from substrates with the three layer electrode. The lower sheet resistance of this substrate (approximately 100 ohms/sq) compared to those using a single layer electrode enabled excellent display uniformity with no fading in the pattern across the display. Both the color saturation and display uniformity were observed to be very good.

Example 2

A multilayer ITO/polymer/ITO stack was fabricated on PET film in the same process as used for Example 1. A laser ablation technique was used to define electrodes for OLED fabrication. Prior to OLED fabrication, PET film with ITO/polymer/ITO multilayer stack was pre-baked at 80° C. overnight in nitrogen atmosphere in order to remove moisture from the film. Immediately before OLED fabrication, the film was treated to a standard oxygen plasma procedure to remove organic residues off the ITO surface and tune the ITO surface characteristics for optimal performance in OLEDs. The OLEDs were fabricated by standard thermal deposition in a vacuum system at base pressure of ca. $10^{-6}$ torr. The following OLED construction was deposited: HIL (300 nm)/HTL (40 nm)/EML (30 nm, 6% dopant)/ETL (20 nm)/LiF (1 nm)/Al (200 nm).

After completion, the OLEDs were encapsulated with 3M encapsulation barrier film employing SAES getter as a desiccant and oxygen scavenger in between the encapsulation film and the OLED cathode. The barrier film was 5 mil PET prepared as described in U.S. Pat. No. 7,018,713. The desiccant was CaO from SAES Getters, Colorado Springs, Colo., USA. Both reference OLEDs on standard PET/ITO (100 nm) substrates and OLEDs on PET/ITO/polymer/ITO multilayer stack were fabricated according to the above-described routine.

Luminance-voltage-current (LIV) characteristics and electroluminescence spectra of the fabricated OLEDs were recorded using a Keithley 2400 source meter as a current source/voltage detector and PhotoResearch PR650 camera as a luminance and spectral detector. The devices with the multilayer stack ITO showed very similar LIV behavior as the reference ones indicating that the multilayer stacked ITO has equivalent electrical performance to the reference ITO, and no additional optical losses are induced by the multilayer stack ITO. Luminance and electroluminescence spectra were also recorded also at various angles for both reference and multilayer stack ITO devices, and it was found they both ITO exhibited very similar angular performance with slightly reduced optical cavity effects with the multilayer ITO stack.

The invention claimed is:

1. A solid state lighting element, comprising layers arranged in the following order:
   a first substrate;
   a first electrode;
   a light emitting material;
   a second electrode; and
   a second substrate,
   wherein at least one of the first and second electrodes comprises:
   a first transparent or semitransparent conductive layer;
   a second transparent or semitransparent conductive layer; and
   a transparent or semitransparent intervening layer located between the first and second conductive layers, wherein the intervening layer comprises an inorganic dielectric,
   wherein the intervening layer includes electrically conductive transparent or semitransparent pathways extending through the intervening layer between and in contact with the first and second conductive layers,
   wherein the first and second conductive layers each comprise a sheet of material and the first conductive layer is substantially coextensive with the second conductive layer.

2. The solid state lighting element of claim 1, wherein the light emitting material comprises an OLED material.

3. The solid state lighting element of claim 1, wherein the first and second conductive layers each comprise a transparent or semitransparent conductive oxide.

4. The solid state lighting element of claim 1, wherein a thickness of the first conductive layer is substantially identical to a thickness of the second conductive layer.

5. The solid state lighting element of claim 1, wherein at least one of the first and second substrates comprises polyethylene terephthalate.

6. The solid state lighting element of claim 1, wherein at least one of the first and second substrates comprises a barrier layer.

7. The solid state lighting element of claim 1, wherein the intervening layer comprises $SiO_2$.

* * * * *